United States Patent
Meyer et al.

(10) Patent No.: US 11,848,248 B2
(45) Date of Patent: Dec. 19, 2023

(54) SYSTEM FOR COOLING A METAL-CERAMIC SUBSTRATE, A METAL-CERAMIC SUBSTRATE AND METHOD FOR MANUFACTURING THE SYSTEM

(71) Applicant: Rogers Germany GmbH, Eschenbach (DE)

(72) Inventors: Andreas Meyer, Wenzenbach (DE); Vitalij Gil, Hersbruck (DE); László Müller, Nuremberg (DE); Rainer Herrmann, Warmensteinach (DE); Stefan Britting, Schnaittach (DE)

(73) Assignee: ROGERS GERMANY GMBH, Eschenbach (DE)

(*) Notice: Subject to any disclaimer, the term of this patent is extended or adjusted under 35 U.S.C. 154(b) by 621 days.

(21) Appl. No.: 17/055,820

(22) PCT Filed: May 14, 2019

(86) PCT No.: PCT/EP2019/062302
§ 371 (c)(1),
(2) Date: Nov. 16, 2020

(87) PCT Pub. No.: WO2019/219656
PCT Pub. Date: Nov. 21, 2019

(65) Prior Publication Data
US 2021/0233828 A1      Jul. 29, 2021

(30) Foreign Application Priority Data

May 18, 2018   (DE) .......................... 102018112000.1

(51) Int. Cl.
*H01L 23/373*   (2006.01)
*H01L 23/15*    (2006.01)
*H01L 23/473*   (2006.01)

(52) U.S. Cl.
CPC .......... *H01L 23/3735* (2013.01); *H01L 23/15* (2013.01); *H01L 23/473* (2013.01)

(58) Field of Classification Search
CPC ... H01L 23/3735; H01L 23/15; H01L 23/473; H01L 21/4871; H01L 23/433; H01L 23/142; H05K 7/20254; H05K 7/20927
See application file for complete search history.

(56) References Cited

U.S. PATENT DOCUMENTS

| 2006/0108098 A1 | 5/2006 | Stevanovic et al. |
| 2016/0218048 A1 | 7/2016 | Kazemi et al. |

(Continued)

FOREIGN PATENT DOCUMENTS

| DE | 202009005305 U1 | 9/2009 |
| DE | 102014112516 B3 | 12/2015 |

(Continued)

OTHER PUBLICATIONS

International Preliminary Report on Patentability for International Application No. PCT/EP2019/062302, International Filing Date May 14, 2019, dated Nov. 19, 2020, 7 pages.

*Primary Examiner* — Mohammed R Alam
(74) *Attorney, Agent, or Firm* — CANTOR COLBURN LLP

(57) ABSTRACT

A system for cooling a metal-ceramic substrate (1) having a component side (5) and a cooling side (6) opposite the component side (5), comprising
   a metallic cooling structure (20) with an integrated fluid channel (30) for guiding fluid within the cooling structure (20), and
   a distribution structure (40) made of plastic for supplying the fluid channel (30) with the fluid,
wherein the cooling structure (20) has on its outer side (A) facing the distribution structure (40) an inlet opening (31) and an outlet opening (32) separate from the inlet opening (Continued)

(31), wherein the inlet opening (31) and the outlet opening (32) are connected to each other via the fluid channel (30) and the fluid channel (30) is configured such that, when the cooling structure is installed, the fluid is guided from the inlet opening (31) in the direction of the component side (5) and is redirected within the cooling structure (20).

17 Claims, 9 Drawing Sheets

(56) References Cited

U.S. PATENT DOCUMENTS

| | | |
|---|---|---|
| 2017/0092565 A1 | 3/2017 | Chen et al. |
| 2017/0186728 A1 | 6/2017 | Chainer |
| 2018/0090845 A1 | 3/2018 | Cohen et al. |

FOREIGN PATENT DOCUMENTS

| | | | |
|---|---|---|---|
| DE | 102015114291 A1 | 3/2016 | |
| DE | 102016125338 A1 | 6/2018 | |
| EP | 2840875 A1 | 2/2015 | |
| JP | 2010278438 A | 12/2010 | |
| JP | 2014175568 A | 9/2014 | |
| WO | 2015027995 A1 | 3/2015 | |
| WO | WO-2015027995 A1 * | 3/2015 | ......... H01L 23/3735 |
| WO | 2014014054 A1 | 7/2016 | |

* cited by examiner

SYSTEM FOR COOLING A METAL-CERAMIC SUBSTRATE, A METAL-CERAMIC SUBSTRATE AND METHOD FOR MANUFACTURING THE SYSTEM

CROSS-REFERENCE TO RELATED APPLICATIONS

This application is a National Stage filing of PCT/EP2019/062302, filed May 14, 2019, which claims priority to DE 10 2018 112 000.1, filed May 18, 2018, both of which are incorporated by reference in their entirety herein.

BACKGROUND

The present invention relates to a system for cooling a metal-ceramic substrate, a method for its manufacturing and a metal-ceramic substrate.

Metal-ceramic substrates are known, for example, as printed circuit boards or circuit boards. Typically, electrical components or elements and conductor paths are arranged on a component side of the metal-ceramic substrate, wherein the electrical components and the conductor paths can be interconnected to form electrical circuits. For special applications, those metal-ceramic substrates have proven to be particularly advantageous, which have an insulating layer including a high electrical insulation strength for the electrical insulation of the individual electrical components and conductor paths, such as an insulating layer made of a corresponding ceramic, for instance.

During operation of these metal-ceramic substrates, the electrical components are typically stressed in such a way that they heat up and local heat sources are formed on the component side. In order to avoid damages to the electrical components or the metal-ceramic substrate caused by heating, the state of the art, e.g. from DE 10 2012 200 325 A1 or DE 10 2014 105 727 A1, knows cooling structures via which the heat can be removed from the metal-ceramic substrate. It turned out to be particularly effective to use a heat exchange with a cooling liquid flowing passing the cooling structure to remove heat. However, due to the development of new types of electrical components, for example made of semiconductor elements such as SiC or GaN, the requirements for cooling systems in terms of cooling performance are also increasing. Furthermore, the manner of operating the state-of-the-art cooling systems sometimes limits the dimensions of a cooling structure for a metal-ceramic substrate.

SUMMARY

One of tasks of the present invention is to provide a cooling system that further improves the cooling performance of metal-ceramic substrates compared to those of the state of the art.

This task is solved by a system for cooling a metal-ceramic substrate as described herein, a metal-ceramic substrate as described herein, and a method for manufacturing the system as described herein. Further advantages and features of the invention result from the dependent claims as well as the description and the attached figures.

According to the invention, a system for cooling a metal-ceramic substrate having a component side and a cooling side opposite the component side is provided, comprising a metallic cooling structure with at least one integrated fluid channel for guiding a fluid within the cooling structure, and a distribution structure, in particular made of plastic, for supplying the fluid channel with the fluid, wherein the cooling structure has on its outer side facing the distribution structure an inlet opening and an outlet opening separate from the inlet opening, wherein the inlet opening and the outlet opening are connected to each other via the fluid channel and the fluid channel is configured such that, when the cooling structure is installed, the fluid is guided from the inlet opening in the direction of the component side and is redirected within the cooling structure.

BRIEF DESCRIPTION OF THE FIGURES

Further advantages and features result from the following description of preferred embodiments with reference to the attached figures. Individual features of the individual embodiments can be combined within the scope of the invention.

DETAILED DESCRIPTION

Figure 1:
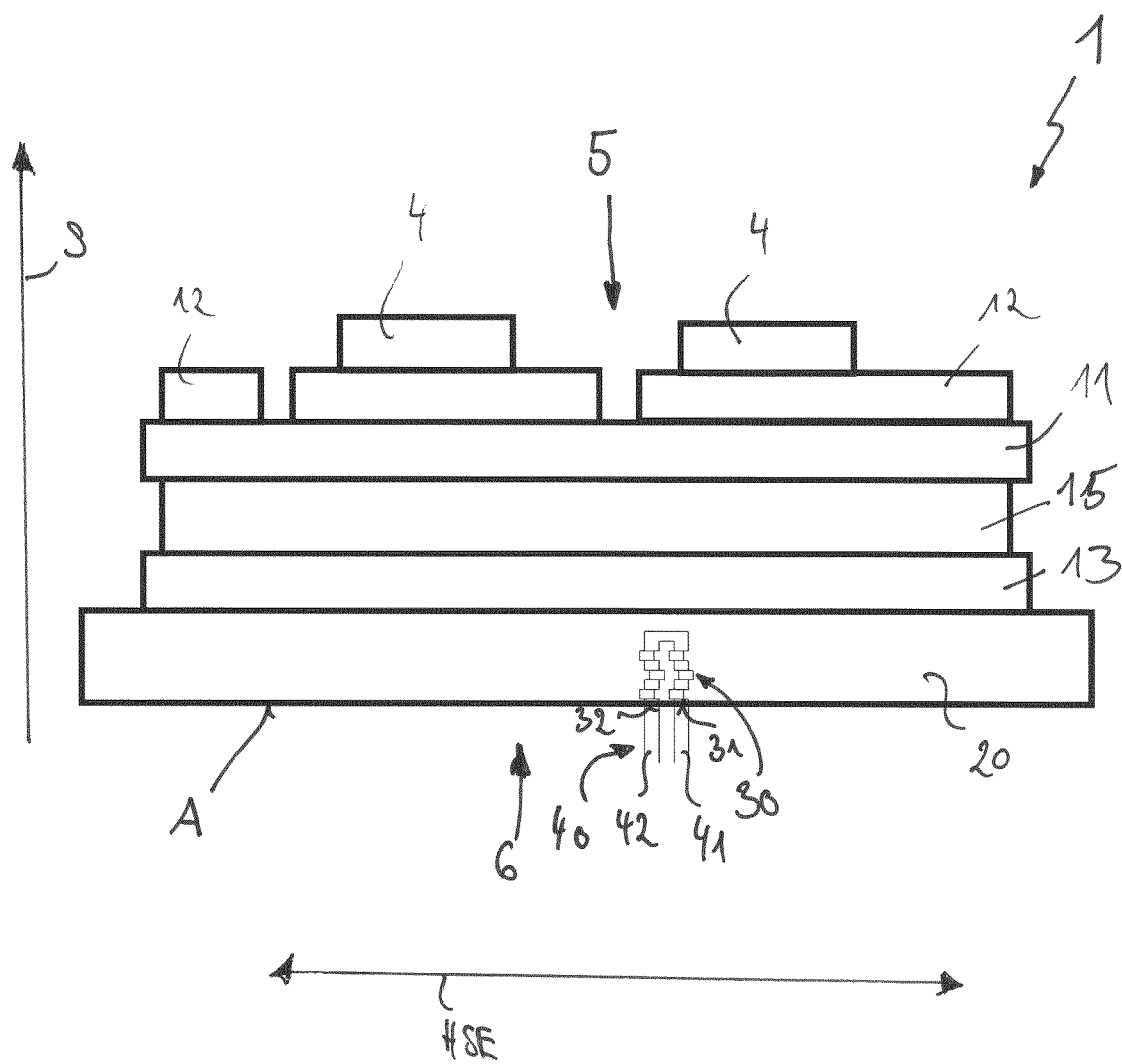
FIG. 1 is a schematic illustration of a metal-ceramic substrate according to a first exemplary embodiment of the present invention.

Compared to the systems for cooling, known from the state of the art, the system according to the invention stands out by the particularly well directed guidance of the fluid. The controlled guidance begins with the distribution structure, which guides the fluid to the inlet opening of the fluid channel. The fluid is then transported along a defined flow path within the cooling structure towards the component side and is again ejected from the cooling structure. The controlled guidance within the cooling structure turned out to be advantageous, because this guidance allows, for example, to create turbulences or to significantly increase a contact surface between the metallic cooling structure and the fluid, which in turn improves the cooling performance of the cooling structure. In addition, the distribution structure ensures that no fluid is directed into or to the outlet opening. In other words, by directing the fluid to the inlet openings, the distribution structure ensures that no unwanted counter flow occurs within the fluid channel and supports a direction or guidance of flow within the fluid channel. Furthermore, the distribution structure can be used to control the distribution of the fluid to several fluid channels in such a way that they are all supplied with fluid at the same temperature, i.e. it can be avoided that fluid already used for cooling is used several times. This has a positive effect on the homogeneity when cooling the entire or complete cooling side.

By making the distribution structure from plastic, it can also be manufactured comparatively easily and cost-effectively, for example by injection molding and/or compression molding. In particular, the distribution structure lies directly against the outer side of the cooling structure when installed.

The distribution structure preferably has the task of diverting the fluid, which is transported along a first main flow direction by means of an infeed structure, in such a way that at least a part of the fluid carried by the infeed structure is redirected to the inlet opening. For this purpose, it is not absolutely necessary that the distribution structure and the outer side of the cooling structure are sealed. It is also intended that the distribution structure is located between the infeed structure and the cooling structure. For example, the distribution structure is enclosed or surrounded by the infeed structure. Preferably, it is provided that the fluid channel has an opening cross-section in a plane perpendicular to the flow direction (in the cooling structure), the diameter of which is smaller than 2 mm, preferably smaller than 1.5 mm and especially preferably smaller than 1 mm or 0.5 mm. This allows the fluid to be directed to the desired position with a comparatively high spatial resolution. Furthermore, it is thus possible to provide the outer side of the cooling structure with several fluid channels for a homogeneous temperature distribution in the cooling structure, wherein the distribution structure preferably supplies several inlet openings, preferably a subset of all inlet openings, with the fluid. Furthermore, it is conceivable that the opening cross-section is square, rectangular, elliptical or circular.

The distribution structure preferably has, in addition to an inlet part, through which the fluid is introduced into the inlet opening, an outlet part, through which the fluid is led away from the outlet opening of the fluid channel. In other words, the distribution structure not only ensures the supply of fluid to the inlet openings, but also ensures a controlled flow from the outlet opening. The inlet part is preferably adjacent to the inlet opening and the outlet part is adjacent to the outlet opening, especially directly. Furthermore, it is conceivable that the distribution structure is configured in such a way that it ensures that no flow occurs or is reduced along the outlet opening parallel to the main extension plane. This is an advantageous way of preventing the fluid ejected from the outlet opening from being affected by the flow that would otherwise occur there.

According to a preferred embodiment of the present invention, it is provided that the cooling structure, in particular the fluid channel, and/or the distribution structure are configured in such a way that a flow direction of the fluid after leaving the distribution structure, e.g. along a second main flow direction, is laterally offset in a direction parallel to the main extension plane with respect to a flow direction of the fluid when entering the distribution structure, e.g. along a first main flow direction. The offset can be caused, for example, exclusively by the fluid channel or exclusively by the distribution structure. In particular, the fluid is laterally offset with respect to the first main flow direction and continues to flow along a second main flow direction. In particular, by "lateral" is meant a transverse offset with respect to the first main flow direction. Preferably, the lateral offset is such large that—viewed along a direction parallel to the first main flow direction—flow cross-sections (dimensioned perpendicular to the first or second main flow direction) do not overlap or intersect. In other words. After leaving the system of cooling structure and distribution structure, the fluid guided by the fluid channel is laterally or laterally offset. This is an advantageous way to avoid mixing a fluid that has already been used for cooling, i.e. a used fluid, with a fresh fluid or a fresh part of the fluid, i.e. supplied fluid and discharged fluid are separated from each other and are further transported below the cooling structure. In this way, it can be ensured that rear fluid channels, viewed along the first main flow direction, are supplied with a fluid whose temperature is substantially equal to the temperature of a fluid introduced into a front fluid channel, viewed along the first main flow direction. This is especially true if several distribution structures are arranged or constructed in series along the first main flow direction or along the first main flow direction. This is an advantageous way to ensure cooling on the cooling side as homogeneous as possible. Whenever fluid is mentioned in this application, this refers in particular to parts of a common fluid intended for cooling. Preferably the fluid is a liquid.

Preferably, a plurality of fluid channels each having an inlet opening are arranged side by side as viewed in a row direction and/or the distribution structure is designed to supply a plurality of inlet openings, especially inlet openings arranged next to each other, with the fluid. The row direction can be parallel to the first main flow direction and/or oblique, in particular perpendicular to the first main flow direction. Furthermore, the outlet openings are also arranged side by side along a row direction, in particular offset parallel to the inlet openings. Preferably, the row direction reflects only a general course and the adjacent fluid channels may be offset to each other within limits (especially determined by the distribution structure). Furthermore, it is conceivable that the distribution structure, in particular the inlet part, is configured in such a way that the inlet openings of the fluid channels are supplied with a fluid in a row, wherein the fluid has essentially the same temperature, independent of the inlet opening and the path covered by the fluid. For example, the distribution structure, in particular the inlet part, comprises for this purpose a ramp-shaped structure, the ramp-shaped structure being inclined in such a way that a distance between the ramp-shaped structure and the outer side of the cooling structure becomes smaller as the distance covered by the fluid increases. This allows a flow to be established which makes a homogeneous cooling with the fluid possible.

Preferably, the fluid channel is U-shaped, wherein the U-shaped fluid channel has two leg regions extending substantially perpendicular to the main extension plane and at least one transverse region connecting the two leg regions. This allows the cooling liquid in the U-shaped cooling channel to be guided as close as possible to the ceramic layer of the metal-ceramic substrate and the cooling substrate is uniformly cooled. In particular, it is intended that the transverse region is arc-shaped and/or forms the point of return of the fluid when viewed in the stacking direction. In particular, it is intended that the fluid channel, viewed in the stacking direction, extends over more than half, preferably more than two thirds, and especially preferably more than three quarters of the total thickness of the cooling structure measured in the stacking direction. Furthermore, it is intended that, seen in the stacking direction (facing the component side in the installed state), a single-layer metal layer, in particular copper layer, adjoins the transverse region. The thickness of this final single-layer metal layer is between 0.2 and 1.5 mm, preferably between 0.4 and 1 and more preferably between 0.6 and 0.8 mm.

In accordance with a further embodiment of the present invention, it is provided that an opening cross-section of the leg regions extending parallel to the main extension plane is shifted laterally along a flow direction within the cooling structure, in particular the leg region comprising a first partial section with a first opening cross-section and a second partial section with a second opening cross-section the first opening cross-section being offset relative to the second opening cross-section by an offset distance as viewed in a direction running parallel to the main extension plane.

Preferably, the offset has a value between 50 µm and 500 µm, preferably between 80 µm and 300 µm and especially preferably between 100 µm and 200 µm. In particular, it is provided that within the first partial section and within the second partial section the opening cross section is not relocated (i.e. the opening cross section is constant when viewed in the stacking direction), so that a discrete jump between the first opening cross section and the second opening cross section occurs. The first and the second partial section define individual layer planes that are assigned to corresponding metal layers, for example, if the cooling structure was formed by stacking different metal layers on top of each other. The metal layers have a thickness measured in the stacking direction of between 100 µm and 1000 µm, preferably between 200 µm and 800 µm, and more preferably between 500 µm and 600 µm. In case of such thicknesses, the etching process (for forming recesses, which form the opening cross-sections in the finished state) can be better controlled, and these thicknesses have also been shown to be beneficial for cooling performance.

By offsetting the first opening cross-section to the second opening cross-section, edges or recesses can be created, particularly at the transitions between the first partial section and the second partial section, which causes the formation of turbulences in the flow within the fluid channel, which in turn have a positive effect on heat dissipation via the cooling structure. It is also conceivable that the turbulences within the fluid channel are realized by structures protruding into the fluid channel.

In a further embodiment of the present invention, it is provided that for forming turbulences in the fluid the fluid at least one of the leg regions has at least in a section a substantially spiral course. The spiral-shaped course is specified in particular by the fact that an opening cross-section of the leg regions extending parallel to the main extension plane is laterally relocated in at least two different directions lying in the main extension plane successively along a flow direction within the cooling structure. Preferably, the relocation takes place over several planes in clockwise or counterclockwise direction. The spiral-shaped offset increases the contact area between the fluid and the metallic cooling structure, which also has a positive effect on heat dissipation and thus on cooling performance.

According to a further embodiment of the present invention, it is intended that the distribution structure comprises a wall-like structure adjacent to the cooling structure, wherein the wall-like structure is inclined with respect to the row direction by less than 15°, preferably extending parallel to the row direction. In particular, it is intended that by means of the wall-like structure, the fluid otherwise transported along the main flow direction is redirected sideways, i.e. transversely to the first main flow direction, in order to transport it to the individual inlet openings respectively. Preferably, both the inlet part and the outlet part are each designed as a wall-like structure.

In a further embodiment of the present invention, it is provided that the distribution structure supplies two adjacent rows of inlet openings with the fluid. In particular, here the inlet part and the outlet part are each formed as a channel with a bottom and two sides laterally delimiting the channel, a longitudinal direction of the channels extending substantially parallel to the row direction. The inlet part designed as a channel is open to the outer side of the cooling structure and is dimensioned and aligned in such a way that it is not arranged below a row of fluid channels when viewed in the stacking direction, but rather below one half of two adjacent rows of fluid channels. Accordingly, in this embodiment two adjacent inlet openings of two different fluid channels or two outlet openings of two different outlet openings form a pair in a direction perpendicular to the direction of the row. Each of these pairs, which themselves form a row in the row direction, is again assigned to an inlet part or an outlet part as channel. In contrast to a distribution structure, in which a wall-like structure shifts the fluid laterally, here the fluid channel ensures a lateral shift. In other words, the fluid is diverted or redistributed from one channel, the inlet part, to an adjacent channel, the outlet part, via the fluid channel. Preferably, the bottom of the inlet part forms a ramp-shaped structure that is inclined in the first main flow direction towards the outer side of the cooling structure. In particular, the bottom of the outlet part, i.e. the adjacent distribution structure, is inclined in the opposite direction, in order to facilitate the outflow of the fluid. In other words, the inclination of the ramp-shaped bottoms in the adjacent channels, which each form an inlet part and an outlet part, are oppositely inclined.

A further object of the present invention is a metal-ceramic substrate having a component side and a cooling side opposite the component side, the metal-ceramic substrate, comprising a ceramic layer, extending along a main extension plane and a metallization layer, the cooling side having a metallic cooling structure with at least one integrated fluid channel for conducting a fluid, and
a distribution structure, in particular made of plastic, for supplying the fluid channel with the fluid, wherein the cooling structure has on its outer side facing the distribution structure an inlet opening and an outlet opening separate from the inlet opening, wherein the inlet opening and the outlet opening are connected to one another via the fluid channel and the fluid channel is configured such that, when the cooling structure is installed, the fluid is guided from the inlet opening in the direction of the component side and is redirected within the cooling structure. All features described for the system according to the invention and their advantages can also be transferred to the system according to the invention and vice versa.

Preferably, it is provided that the metal-ceramic substrate has a secondary layer in addition to a ceramic layer, and a metallic intermediate layer is arranged between the ceramic layer and the secondary layer, the metallic intermediate layer being thicker than the thickness of the ceramic layer, the thickness of the secondary layer and/or the sum of the thicknesses of the ceramic layer and the secondary layer when viewed in the stacking direction. Preferably, the metallic intermediate layer is thicker than 1 mm, preferably thicker than 1.5 mm and particularly preferably thicker than 2.5 mm for optimum thermal spreading and/or the metallic intermediate layer is formed as a single layer.

Furthermore, it is preferred that the cooling structure is an integral part of the metal-ceramic substrate. For this purpose, the cooling structure is preferably connected to the ceramic layer and/or the secondary layer by means of a DCB (direct copper bonding) process, a DAB (direct aluminium bonding) process and/or an AMB (active metal brazing) process.

A further object of the present invention is a method for manufacturing a system according to the present invention, wherein the cooling structure with the at least one fluid channel is manufactured by a layer construction and/or by a 3D printing process. All features described for the system according to the invention or the metal-ceramic substrate and their advantages can also be analogously transferred to the process according to the invention and vice versa.

If the fluid channel is manufactured by means of a layered structure, it is preferred that recesses are punched and/or etched into the individual metal layers and then the individual layers are arranged one above the other along the stacking direction so that the fluid channel is formed. For this purpose, the individual recesses, which define the first or the second opening cross-section in the finished state, are aligned accordingly. In particular, one of the metal layers has an elongated hole instead of two recesses, for example punched or etched. In the later assembled cooling structure, this elongated hole forms the transverse region in which the fluid is redirected. The individual metal layers can be made of different metals or have different thicknesses. In particular, it is conceivable that the metal layers with the recesses for forming the fluid channel differ from those in which no recesses are made and which, in the assembled state, are located between the transverse region of the fluid channel and the ceramic layer or secondary layer.

Materials conceivable as materials for the metallization layer, the intermediate layer, the cooling structure and/or a layer of the cooling structure are copper, aluminium, molybdenum and/or their alloys, as well as laminates such as CuW, CuMo, CuAl, AlCu and/or CuCu, in particular a copper sandwich structure with a first copper layer and a second copper layer, wherein a grain size in the first copper layer differs from a second copper layer. Furthermore, it is preferably intended that the metallization layer is surface modified. As a surface modification, for example, a sealing with a noble metal, in particular silver and/or gold, or ENIG ("Electroless nickel immersion gold") or an edge sealing at the first or second metallization layer to suppress crack formation or expansion is conceivable. Preferably, it is intended that the metal layers are connected to each other by a DCB process and/or soldering process to form the cooling structure. For example, the metal layers are placed on top of each other and then soldered and/or sintered.

Preferably, the ceramic layer $Al_2O_3$, $Si_3N_4$, AlN, an HPSX ceramic (i.e. a ceramic with an $Al_2O_3$ matrix comprising an x percent share of $ZrO_2$, for example $Al_2O_3$ with 9% $ZrO_2$=HPS9 or $Al_2O_3$ with 25% $ZrO_2$=HPS25), SiC, BeO, MgO, high-density MgO (>90% of the theoretical density), TSZ (tetragonally stabilized zirconium oxide) or ZTA as the material for the ceramic. It is also conceivable that the insulating layer is designed as a composite or hybrid ceramic, in which several ceramic layers, each differing in terms of its material composition, are arranged on top of each other and joined together to form an insulating layer in order to combine various desired properties. Preferably, a highly thermally conductive ceramic is used for the lowest possible thermal resistance.

In a preferred embodiment of the present invention, it is provided that the metal-ceramic substrate with the cooling structure and/or the distribution structure is configured thermomechanically symmetrical, in particular along a stacking direction perpendicular to a main extension plane of the carrier substrate. A thermomechanical symmetrical configuration means in particular that thermomechanical coefficients of expansion are symmetrical when viewed in the stacking direction. The thermomechanical coefficient of expansion is a measure for the expansion of the respective layer during a temperature change or a temperature modification. Preferably, metal-ceramic substrates can be divided into virtual sub-substrates, in particular with a virtual primary substrate, a virtual secondary substrate and a virtual intermediate layer, and the thermal expansion coefficients of the virtual sub-substrates are distributed symmetrically in the stacking direction. In particular, the secondary substrate takes into account the cooling structure and/or the distribution structure, wherein in the case of the cooling structure, a thermomechanical effective thickness is assumed for the cooling structure, which takes into account the existence of the fluid channels in the cooling structure.

Due to the symmetrical configuration of the expansion coefficients, a metal-ceramic substrate is provided in an advantageous way, which is comparatively low in distortion compared to temperature changes caused by operation or environmental conditions. As a result, defects or cracks can be avoided, which would otherwise be caused by thermally induced mechanical stress.

Further advantages and features result from the following description of preferred embodiments of the subject matter of the invention with reference to the attached figures. Individual features of the individual embodiments can be combined within the scope of the invention.

FIG. 1 schematically shows a metal-ceramic substrate 1 according to a first exemplary embodiment of the present invention. Such metal-ceramic substrates 1 preferably are used as carriers of electronic or electrical components 4, which can be connected to the metal-ceramic substrate 1. Essential components of such a metal-ceramic substrate 1 are a ceramic layer 11 extending along a main extension plane HSE and a metal layer 12 bonded to the ceramic layer 11. The ceramic layer 11 is made of at least one material comprising a ceramic. The metal layer 12 and the ceramic layer 11 are arranged on top of each other along a stacking direction S perpendicular to the main plane HSE and are materially bonded to each other via a bonding surface. In the finished state, the metal layer 12 is structured on the component side 5 of the metal-ceramic substrate 1 to form conductor paths or connection terminals for the electrical components. In the illustrated embodiment, the metal-ceramic substrate 1 comprises a secondary layer 13 and a metallic intermediate layer 15 arranged between the ceramic layer 11 and the secondary layer 13. The ceramic layer 11, the metallic intermediate layer 15 and the secondary layer 13 are arranged one above the other along the stacking direction S. Furthermore, it is provided that the metallic intermediate layer 15 is thicker than the ceramic layer 11 and/or the secondary layer 13. Preferably, the metallic intermediate layer 15 is thicker than 1 mm, preferably thicker than 1.5 mm and especially preferably thicker than 2.5 mm. While the ceramic layer 11 is preferably made of a ceramic and is configured to provide a sufficient insulation strength and to stiffen the metal-ceramic substrate 1, the secondary layer 13 can also be made of tungsten or molybdenum, for example, as no pronounced insulation strength is required here. In this way, material costs can be reduced. Alternatively, the secondary layer 13 is also made of a material comprising a ceramic.

A metal cooling structure 20 is provided on a cooling side 6 of the metal-ceramic substrate 1 opposite the component side 5. The metallic cooling structure 20 is preferably directly connected to the secondary layer 13.

This prevents an interface, which would be otherwise formed, from having a negative effect on thermal conductivity due to the corresponding bonding material and thus restricts heat dissipation from component side 5 to cooling side 6. For example, the cooling structure 20 is directly bonded to the secondary layer 13 via an AMB process, a DCB (direct copper bonding) or DAB (direct aluminium bonding) process. In particular, it is provided that a plurality of fluid channels 30 is integrated into the metallic cooling structure 20. For the sake of clarity, FIG. 1 shows only one of these fluid channels 30 as an example. The fluid channels 30 are used for the controlled guidance of a fluid, in particular a cooling fluid, within the metallic cooling structure 20. The fluid is fed to the cooling structure 20 via a distribution structure 40 and discharged again via the distribution structure 40. Preferably, the distribution structure 40 has an inlet part 41 and an outlet part 42.

In particular, the fluid channel 30 has an inlet opening 31 and an outlet opening 32 spaced from the inlet opening 31. In particular, the inlet opening 31 and the outlet opening 32 are part of an outer side A of the cooling structure 20 facing the distribution structure 40. Preferably, the inlet part 31 of the distribution structure 40 is adjacent to the inlet opening 31 and the outlet part 42 being adjacent to the outlet opening 32.

Figure 2:
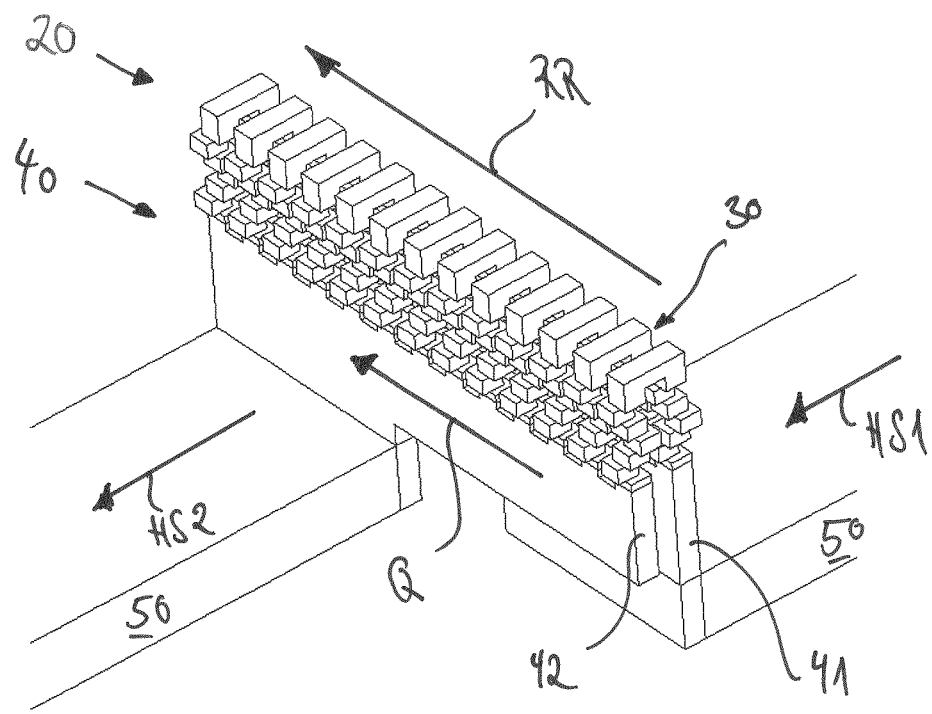
FIG. 2, FIG. 3, FIG. 4, FIG. 5, and FIG. 6 are each a detailed illustration of the system of cooling structure and distribution structure of the first exemplary embodiment of the present invention.
Figure 3:
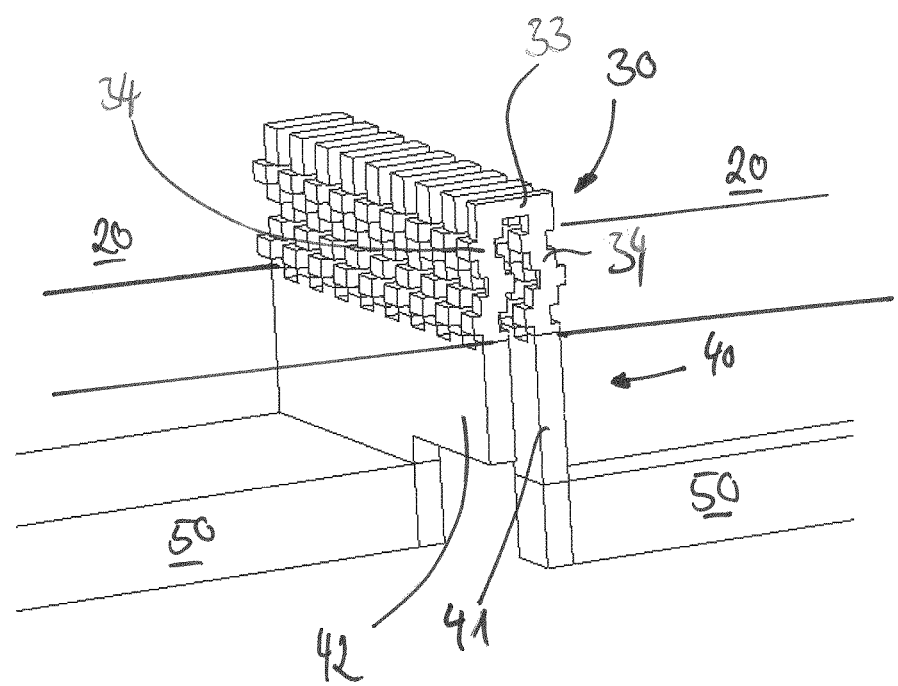
Figure 4:
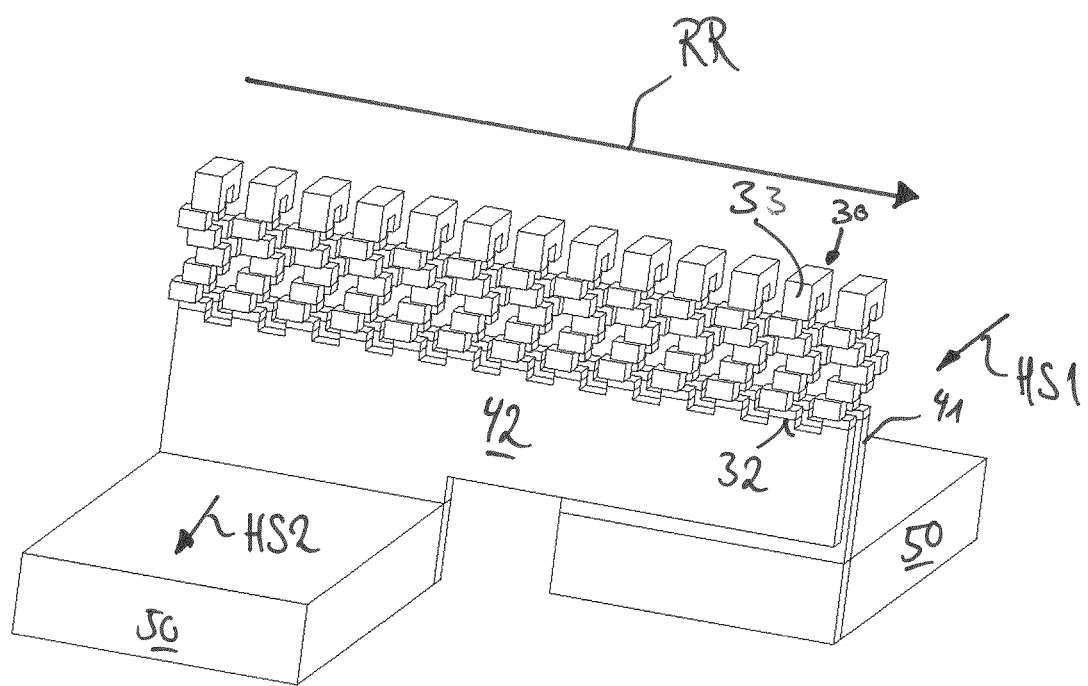
Figure 5:
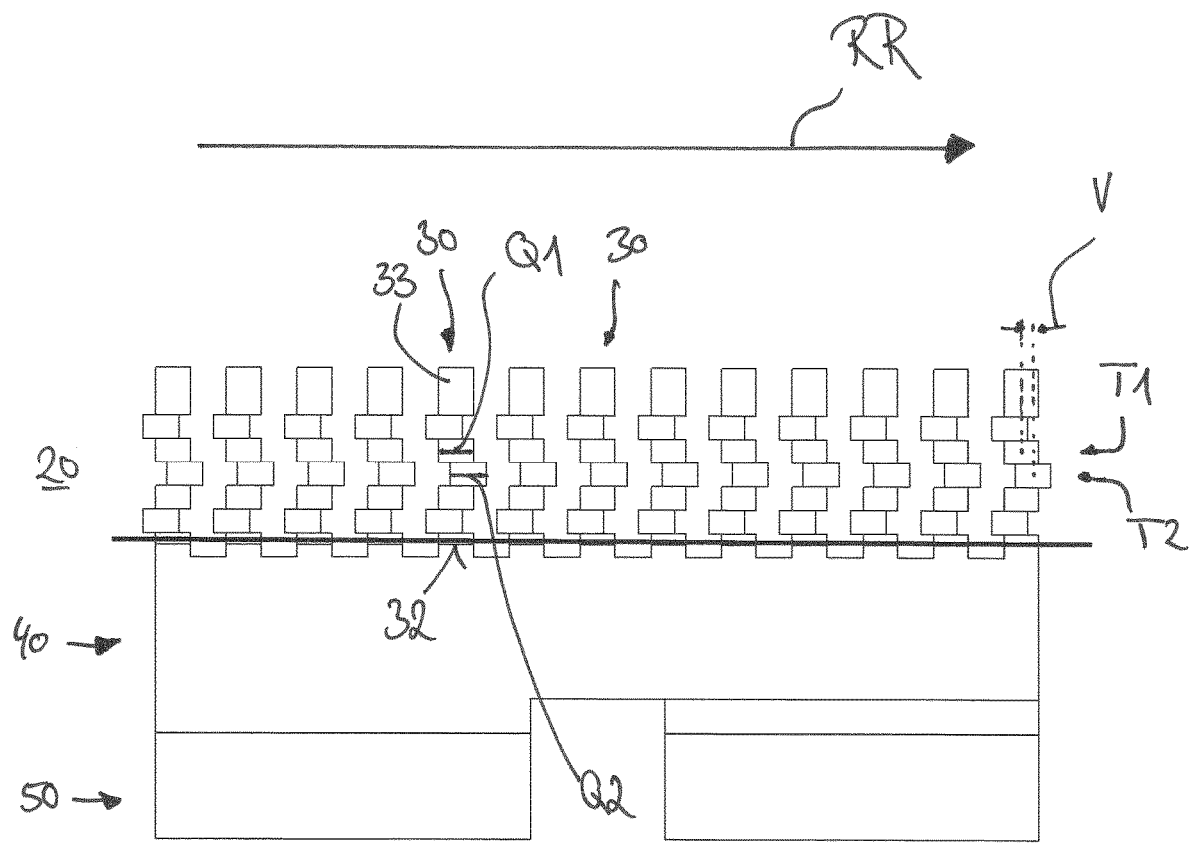
Figure 6:
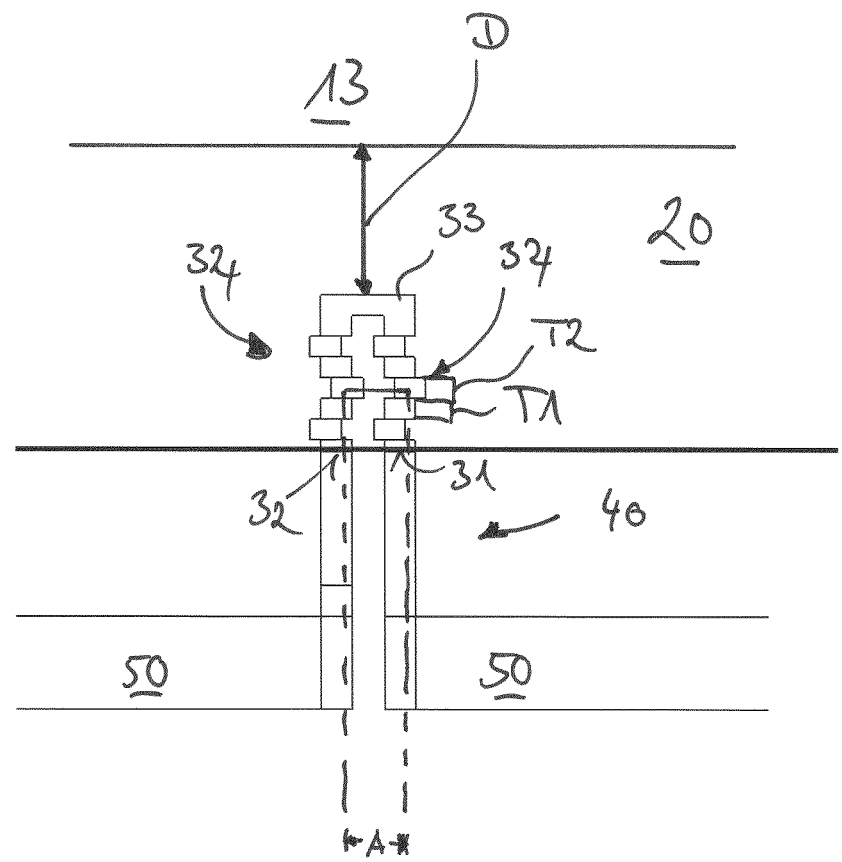

In FIGS. 2 to 4, only the metallic cooling structure 20 and the distribution structure 40 are shown in a perspective view and in FIGS. 5 and 6 in two different side views. In the Figures—instead of the entire cooling structure 20—several fluid channels 30 of the cooling structure 20 are shown. In other words, the fluid channels 30 are shown here without the metallic body in which they are embedded.

Furthermore, viewed in stacking direction S, an infeed structure 50 is connected to the bottom of the distribution structure 40. Accordingly, the distribution structure is located between the cooling structure and the infeed structure when viewed in stacking direction S. Such an infeed structure 50 is preferably provided to provide a first main flow direction HS1. For example, the infeed structure is channel-shaped. Furthermore, the infeed structure 50 has at least one inlet and one outlet (not shown here) to which a fluid circuit can be connected or a cooling fluid supply and a cooling fluid disposal. The distribution structure 40 is preferably configured in such a way that it diverts the fluid from a stream flowing along the first main flow direction HS1 into the cooling structure 20 or introduces it there. Furthermore, FIGS. 2 to 5 show only a single row of fluid channels 30 for sake of the overview. It is preferable provided that several rows are arranged next to each other or behind each other in a direction perpendicular to the row direction RR and parallel to the main plane HSE and each of these rows is supplied with the fluid via a corresponding distribution structure 40, for example a single distribution structure. Preferably, these several rows extend completely over the outer side A of cooling structure 20 facing the distribution structure.

In particular, it is provided that several fluid channels 30 are arranged side by side. In particular, the fluid channels 30 of the embodiment shown are arranged along a row, which in the embodiment shown is essentially perpendicular to the first main flow direction HS1. Basically it is also conceivable that the row runs along a row direction RR, which is inclined by an angle between 0 and 90° with respect to the first main flow direction HS1. Preferably the angle is smaller than 45°.

In the embodiment shown in FIGS. 2 to 6, it is provided that the distribution structure 40 redirects the fluid in such a way that at least a portion of the fluid is initially redirected from a first main flow direction HS1 to a transverse direction Q, being parallel to the row direction, before it is directed into the inlet openings 31. In addition, the fluid is directed in the direction of the inlet opening 31 towards the cooling structure 20, i.e. upwards. This allows the distribution structure to supply several inlet openings 31 of different fluid channels 30 with fluid having the same temperature. For this purpose, the inlet part 41 is designed as a wall-like structure which, in the embodiment shown, runs essentially parallel to the row direction RR. It is preferable provided that the infeed structure 50 feeds the fluid to only a part of the distribution structure 40. In the embodiment shown, essentially a first part, in particular a left half, of the inlet part 41 is used for forming a flow of the cooling fluid along the first main flow direction HS1. However, the complete row of fluid channels 30 is supplied with the fluid by means of the distribution structure 40. Preferably, the inlet part comprises a ramp-like structure, which is inclined in the row direction RR, especially with respect to the main extension plane HSE.

After passing through the fluid channels 30, the fluid leaves the cooling structure 20 via the outlet openings 32 and is led into the outlet part 42 of the distribution structure. The outlet part 42 of the distribution structure 40 is also configured as a wall-like structure that is essentially parallel to the row direction RR. In particular, it is intended that the outlet part 42 is configured to collect the fluid coming out of the outlet openings 42 and to redirect it in a second main flow direction HS2 back into the infeed structure 50. For example, the outlet part 42 comprises a ramp-like structure inclined in the row direction RR, in particular inclined relative to the ramp-like structure in the inlet part 41 of the distribution structure 40. It is further provided that the first main flow direction HS1 and the second main flow direction HS2 are offset parallel to each other. In other words: After leaving the distribution structure 40, the flow of the fluid is laterally or sideways offset with respect to the flow when entering the distribution structure 40.

In the embodiment shown, the inlet part 41 of the distribution structure 40 is located in front of the outlet part 42 of the distribution structure 40, seen along the first main flow direction HS1. However, it is also conceivable that the outlet part 42 is arranged in front of the inlet part 31 of the distribution structure 40, seen along the first main flow direction HS1.

The individual fluid channels 30 are preferably U-shaped, wherein the U-shaped fluid channel 30 has two leg regions 34 extending essentially perpendicular to the main extension plane HSE and a transverse region 33 connecting the two leg regions 34. In particular, the transverse region 33 is used to redirect the fluid and is closest to the secondary layer 13 or the ceramic layer 11 when installed. Preferably, a distance between the transverse region 33 and a ceramic layer 11 or secondary layer 13 adjacent to the cooling structure 20 has a value between 0.2 and 1.5 mm, preferably between 0.4 and 1 and particularly preferably between 0.6 mm and 0.8 mm. Preferably, the fluid channels 30, especially their leg regions 34, are configured in such a way that the fluid experience a turbulence within the fluid channels 30. For this purpose, for example, it is intended that an opening cross-section $Q1$, $Q2$ of the leg regions 34 running parallel to the main extension plane HSE is shifted laterally along a flow direction of the fluid within the fluid channel 30, in particular within the leg region 34. The leg region 34 comprises a first section T1 with a first opening cross section $Q1$ and a second section T2 with a second opening cross section $Q2$, wherein the first opening cross section $Q1$ is offset by an offset distance V from the second opening cross section $Q2$ when viewed in a direction running parallel to the main extension plane HSE. Preferably, the first opening cross section $Q1$ and the second opening cross section $Q2$ are of equal size. However, it is also conceivable that the first opening cross section differs from the second opening cross section. In particular, the first section T1 and the second section T2 are each assigned to metal layers, which are, for example, stacked on top of each other during production. The individual metal layers can have the same thickness or differ in their thickness. It is also conceivable, for example, that the thickness of the individual layers decreases and/or increases towards the component side.

In particular, it is provided that the first opening cross section Q1 and the second opening cross section Q2 are offset to each other in a direction parallel to the first main flow direction HS1 or the second main flow direction HS2, respectively, and in a direction parallel to the row direction RR, i.e. in two directions, which are not parallel to each other. Preferably, a ratio of an overlap area, in which the first opening cross-section Q1 and the second opening cross-section Q2 are arranged one above the other as viewed in stacking direction S, and the first opening cross-section Q1 or the second opening cross-section Q2, respectively, has a value between 0.5 and 0.9, preferably between 0.5 and 0.8 and more preferably between 0.5 and 0.7. In particular, it is conceivable that the opening cross-section of the entrance opening and/or the exit opening is larger than the first opening cross-section and/or the second opening cross-section. This allows a funnel-shaped inlet area and outlet area for the fluid channel to be formed.

However, it is also conceivable that the first opening cross-section Q1 and the second opening cross-section Q2 are of different sizes. Preferably, the first and second opening cross-sections are configured in such a way that they form a substantially spiral shaped course for the fluid channel 30. The fluid channels 30 can be realized, for example, by stacking metal layers having corresponding openings or by a 3D printing process. Furthermore, it is provided that the inlet opening 13 has a first opening cross-section, the diameter and/or edge length of which has a value between 0.1 mm and 2.5 mm, preferably between 0.5 mm and 1.5 mm and more preferably essentially 1 mm. It is preferably provided that the first opening cross-section Q1 or the second opening cross-section Q2 do not change within the leg regions 34 of the fluid channel 30.

Furthermore, it is provided that a distance A between two adjacent leg regions, preferably of the same fluid channel, should have a value between 0.1 mm and 5 mm, preferably between 0.2 mm and 2 mm and more preferably essentially 1.5 mm. The distance A between two centers of the first cross-sectional opening Q1 or second cross-sectional openings Q2 is measured at the same height in stacking direction S.

Figure 7:
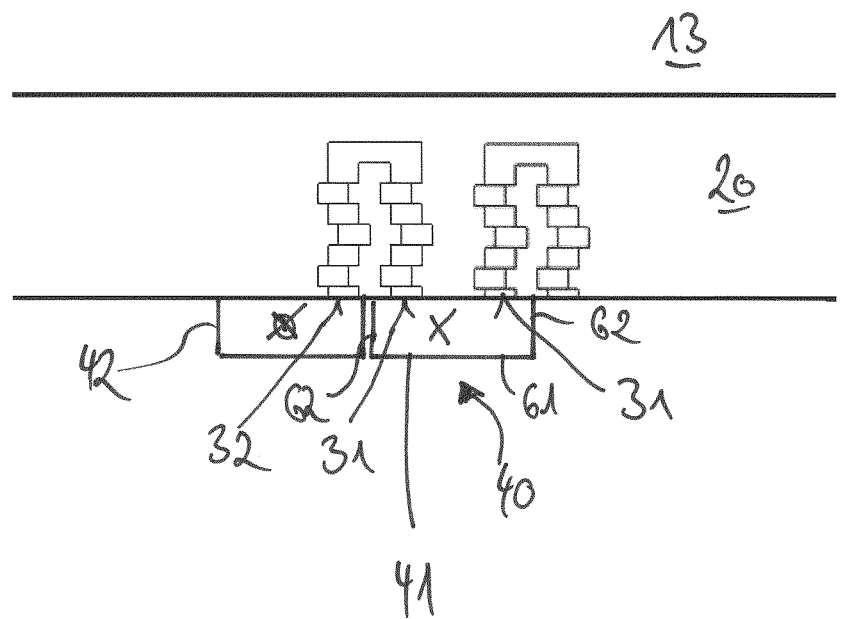
FIG. 7 is an illustration of a system of cooling structure and distribution structure according to a second exemplary embodiment of the present invention.

FIG. 7 shows an arrangement of a cooling structure 20 and a distribution structure 40 according to a further embodiment of the present invention. In particular, it is intended that the inlet part and the outlet part are essentially shell-like-shaped or channel-shaped, the shell-like-shaped structure being open to the outer side A of the cooling structure 20 and immediately adjacent to it. In the embodiment shown, the shell element comprises in particular a bottom 61 and two sides 62 projecting perpendicularly from the bottom 61, and it is further provided that the shell element extends substantially longitudinally parallel to the row direction RR, so that the shell element directs the fluid along the outer side of the cooling structure 20 in a direction which, for example, projects into the drawing plane (indicated by x). In particular, it is provided that the shell element is dimensioned along the main extension plane HSE in such a way that the shell element supplies inlet openings 31 of two fluid channels arranged in adjacent rows. In other words, in the embodiment of FIG. 7, the inlet openings 31 of the fluid channels 30 in adjacent rows share an inlet part 41 and are arranged adjacent to each other. I.e., in a direction perpendicular to the row direction RR, the inlet openings 31 and outlet openings 32 for the fluid channels do not alternate but form pairs that are assigned alternately to the inlet part 41 and the outlet part 42. After leaving the fluid channel 30 of the cooling structure via the respective outlet openings 32, the fluid is introduced into another shell element which forms the outlet part 42 of the distribution structure and runs parallel to the inlet part 41. As a result a pair of two rows of adjacent outlet ports 42 is provided to the outlet part of the distribution structure 40.

Figure 8:
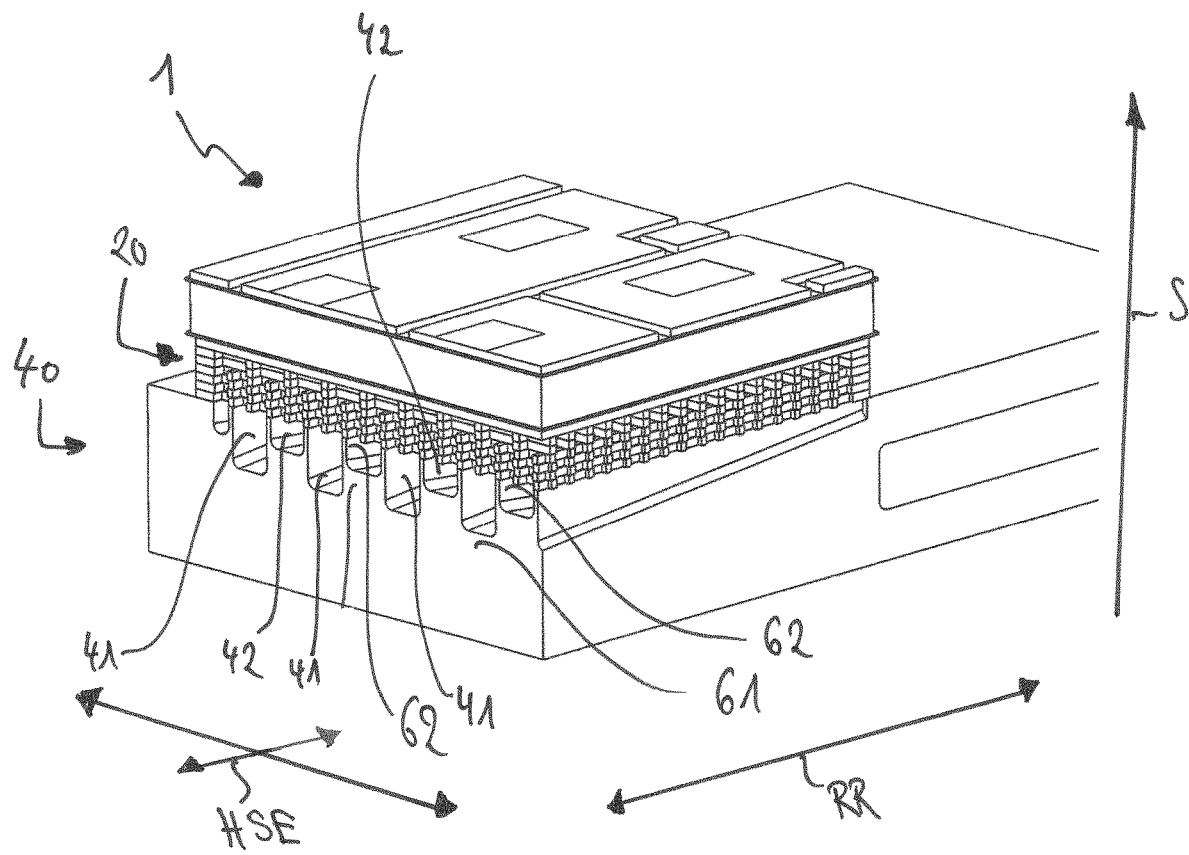
FIG. 8 is a perspective view of the system from FIG. 7.

FIG. 8 shows a perspective view of the system from FIG. 7. In particular, the shell elements or channels arranged next to each other can be identified, which alternately form the inlet part 41 and the outlet part 42. The inlet part 41 and the outlet part 42 differ from each other by their inclinations of the ramp-shaped bottom 61. Preferably, the ramp-shaped bottom of the inlet part 41 and the ramp-shaped bottom of the outlet part 42 are orientated opposite to each other. Preferably, the ramp-shaped bottoms 61 can be inclined by the same absolute angle. For example, the ramp-shaped bottoms 61 of all inlet parts 41 run parallel and the ramp-shaped bottoms 61 of all discharging outlet 42 run parallel to each other. The inclination of the bottoms 61 is especially used to control the flow velocity within the distribution structure. Alternatively or supplementary it would also be conceivable that the shell elements are tapered in the flow direction to adjust the flow velocity, i.e. their width is reduced. In particular, metal layers can be seen here in FIG. 8.

Figure 9:
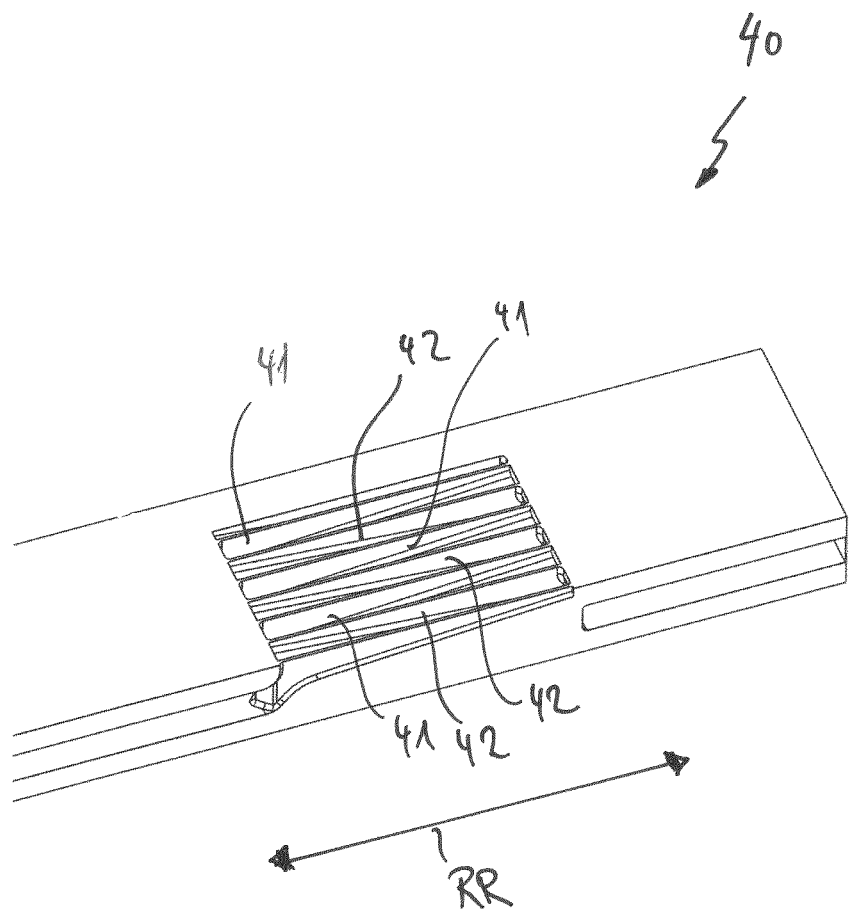
FIG. 9 is a perspective view of the distribution structure from FIG. 8.

FIG. 9 shows schematically the distribution structure 40 of the system from FIGS. 7 and 8. Here, the fluid is fed in and discharged from the side, for example via connections provided here.

REFERENCE LIST

1 Metal-Ceramic Substrate
4 Component
5 Component side
6 Cooling side
11 Ceramic layer
12 Metal layer
13 Secondary layer
15 Intermediate layer
20 Cooling structure
30 Fluid channel
31 Inlet opening
32 Outlet opening
33 transverse region
34 leg region
40 Distribution structure
41 inlet part
42 outlet part
50 Infeed structure
61 bottom
62 side
T1 first partial section
T2 second partial section
Q transverse direction
Q1 first opening cross section
Q2 second opening cross section
HS1 first main flow direction
HS2 second main flow direction
HSE main expansion plane
S Stacking direction

The invention claimed is:
1. A system for cooling a metal-ceramic substrate (1) having a component side (5) and a cooling side (6) opposite the component side (5), comprising a metallic cooling structure (20) with at least one integrated fluid channel (30) for guiding a fluid within the cooling structure (20), and a distribution structure (40) made of plastic, for supplying the fluid channel (30) with the fluid, wherein the cooling structure (20) has on its outer side (A) facing the distribution structure (40) an inlet opening (31) and an outlet opening (32) separate from the inlet opening (31), wherein the inlet opening (31) and the outlet opening (32) are connected to each other via the fluid channel (30) and the fluid channel (30) is configured such that, when the cooling structure is installed, the fluid is guided from the inlet opening (31) in the direction of the component side (5) and is redirected within the cooling structure (20), wherein a plurality of fluid channels (30) each having an inlet opening (31) are arranged side by side as viewed in a row direction (RR) and/or the distribution structure (40) is designed to supply a plurality of inlet openings with the fluid.

2. The system according to claim 1, wherein the fluid channel (30), and/or the distribution structure (40) of the cooling structure (20) are configured such that in a direction running parallel to a main extension plane (HSE) of the cooling structure (20) a flow direction of the fluid after leaving the distribution structure (40) is laterally offset with respect to a flow direction of the fluid when entering the distribution structure (40).

3. The system according to claim 1, wherein the fluid channel (30) is U-shaped, wherein the U-shaped fluid channel (30) has two leg regions (34) extending substantially perpendicular to the main extension plane (HSE) and at least one transverse region (33) connecting the two leg regions (34).

4. The system according to claim 3, wherein an opening cross-section of the leg regions (34) extending parallel to the main extension plane (HSE) is shifted laterally along a flow direction within the cooling structure (30).

5. The system according to claim 3, wherein for forming turbulences in the fluid the fluid at least one of the leg regions (34) has at least in a section a substantially spiral course.

6. The system according to claim 3, wherein the distribution structure (40) comprises a wall-like structure adjacent to the cooling structure (20), wherein the wall-like structure is inclined with respect to the row direction (RR) by less than 15°.

7. The system according to claim 1, wherein the distribution structure (40) supplies two adjacent rows of inlet openings (30) with the fluid.

8. A metal-ceramic substrate (1) having a component side (5) and a cooling side (6) opposite the component side (5), the metal-ceramic substrate (1) comprising a ceramic layer (11) extending along a main extension plane (HSE) and a metallization layer (12), the cooling side (6) having a metallic cooling structure (20) with at least one integrated fluid channel (30) for conducting a fluid, and a distribution structure (40) made of plastic, for supplying the fluid channel (30) with the fluid, wherein the cooling structure (20) has on its outer side (A) facing the distribution structure (40) an inlet opening (31) and an outlet opening (32) separate from the inlet opening (31), wherein the inlet opening (31) and the outlet opening (32) are connected to one another via the fluid channel (30) and the fluid channel (30) is configured such that, when the cooling structure is installed, the fluid is guided from the inlet opening (31) in the direction of the component side (5) and is redirected within the cooling structure (20), and wherein a plurality of fluid channels (30) each having an inlet opening (31) are arranged side by side as viewed in a row direction (RR) and/or the distribution structure (40) is designed to supply a plurality of inlet openings with the fluid.

9. A method for manufacturing a system according to claim 1, wherein the cooling structure (20) with the at least one fluid channel (30) is manufactured by a layer construction and/or by a 3D printing process.

10. The system according to claim 4, wherein the leg region (34) comprising a first partial section (T1) with a first opening cross-section (Q1) and a second partial section (T2) with a second opening cross-section (Q2), the first opening cross-section (Q1) being offset relative to the second opening cross-section (Q2) by an offset distance (V) as viewed in a direction running parallel to the main extension plane (HSE).

11. The system according to claim 4, wherein for forming turbulences in the fluid the fluid at least one of the leg regions (34) has at least in a section a substantially spiral course.

12. The system according to claim 4, wherein the distribution structure (40) comprises a wall-like structure adjacent to the cooling structure (20), wherein the wall-like structure is inclined with respect to the row direction (RR) by less than 15.

13. The system according to claim 12, wherein the wall-like structure extends parallel to the row direction.

14. The system according to claim 5, wherein the distribution structure (40) comprises a wall-like structure adjacent to the cooling structure (20), wherein the wall-like structure is inclined with respect to the row direction (RR) by less than 15°, preferably extending parallel to the row direction.

15. The system according to claim 14, wherein the wall-like structure extends parallel to the row direction.

16. A method for manufacturing a system according to claim 8, wherein the cooling structure (20) with the at least one fluid channel (30) is manufactured by a layer construction and/or by a 3D printing process.

17. A method for manufacturing a system according to claim 9, wherein the cooling structure (20) with the at least one fluid channel (30) is manufactured by a layer construction and/or by a 3D printing process.

* * * * *